United States Patent
Maru

(10) Patent No.: US 8,076,845 B2
(45) Date of Patent: Dec. 13, 2011

(54) DISPLAY APPARATUS

(75) Inventor: Hiroyuki Maru, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/633,089

(22) Filed: Dec. 8, 2009

(65) Prior Publication Data

US 2010/0141117 A1    Jun. 10, 2010

(30) Foreign Application Priority Data

Dec. 10, 2008    (JP) ................. 2008-314606

(51) Int. Cl.
*H01J 1/62*    (2006.01)
(52) U.S. Cl. ....................... 313/506; 313/509
(58) Field of Classification Search ........... 313/498–512
See application file for complete search history.

(56) References Cited

U.S. PATENT DOCUMENTS

| | | | |
|---|---|---|---|
| 6,867,541 B2 * | 3/2005 | Okuyama et al. | 313/506 |
| 7,227,312 B2 | 6/2007 | Kwak | |
| 2005/0162081 A1 * | 7/2005 | Kwak et al. | 313/506 |
| 2005/0200270 A1 | 9/2005 | Kwak | |

* cited by examiner

*Primary Examiner* — Bumsuk Won

(57) ABSTRACT

In a display apparatus, a thin film transistor, a planarization film, and at least two light-emitting devices are provided on a substrate, and the light-emitting device at least includes a light-emitting layer and first and second electrodes. At least two first contact holes and at least two second contact holes are provided in the planarization film at a part outside a display region and connect the first electrode to ground wiring and/or power wiring with a resistance lower than that of the first electrode, the distance between the second contact hole and the display region is longer than that between the first contact hole and the display region, and the opening area of the second contact hole is smaller than that of the first contact hole.

4 Claims, 5 Drawing Sheets

DISPLAY APPARATUS

BACKGROUND OF THE INVENTION

1. Field of the Invention

The present invention relates to the shape of a contact hole provided in a display apparatus, the shape being determined when a transparent conductive oxide (TCO) electrode is connected to wiring (power wiring and/or ground (GND) wiring).

2. Description of the Related Art

A light-emitting device using organic electro luminescence (hereinafter referred to as organic EL) has been provided, for example, for a matrix display apparatus that can perform full-color light emission, the matrix display apparatus including a pixel with a film provided on a substrate, where the film includes materials producing colors including red (R), green (G), and blue (B).

Here, as a method of moving an upper electrode provided on the light-extraction side from a high sheet resistance such as an indium tin oxide (ITO) to GND wiring with a low sheet resistance including aluminum (Al), the method being performed in the light-emitting device, the following technology has been disclosed in US 2005/0200270 (first patent document). According to the above-described document, the opening area of each contact hole is reduced and a plurality of the contact holes is arranged in single file.

However, if the plurality of contact holes is provided in single file along a contact hole display region extending from a TCO electrode to low-resistant wiring, as is the case with US 2005/0200270, parasitic resistances existing between the contact holes are increased. Further, currents intensively flow into the contact holes and the parasitic resistances are increased in appearance, which may cause power losses.

Further, according to U.S. Pat. No. 7,227,312 (second patent document), a plurality of contact holes having the same areas is arranged in three files and the shape of grating in a direction from a display region toward the contact holes.

However, according to the above-described configuration, it is assumed that the amount of currents flowing into the contact holes is decreased as the distance between the display region and the contact holes is increased.

The above-described problem occurs especially when a TCO electrode with a high resistance is electrically connected to wiring with a resistance lower than the resistance of the TCO electrode. This is because when a current flows into the low-resistant wiring via a contact hole provided near the display region, most of the current does not return to the high-resistant TCO electrode.

Therefore, as the distance between the display region and the contact holes is increased, the amount of currents flowing into the contact holes is decreased.

Consequently, the opening area is unnecessarily increased in relation to the amount of currents flowing into the contact holes provided at a distance from the display region so that a narrow frame may be achieved with difficulty.

SUMMARY OF THE INVENTION

The present invention has been achieved to decrease power losses and achieve a narrow frame without increasing a parasitic resistance reducing currents intensively flowing into contact holes.

More specifically, a display apparatus according to an embodiment of the present invention includes a substrate, a thin-film transistor provided on the substrate, a planarization film provided on the thin-film transistor, and a plurality of light-emitting devices provided on the planarization film to provide a display region, wherein, in the light-emitting device, a second electrode, a light-emitting layer, and a first electrode are stacked on the substrate in that order, wherein a plurality of first contact holes and a plurality of second contact holes are provided in the planarization film at a part outside the display region connect the first electrode to wiring with a resistance lower than a resistance of the first electrode, and wherein a distance between the second contact hole and the display region is longer than a distance between the first contact hole and the display region, and an opening area of the second contact hole is smaller than an opening area of the first contact hole.

Further features of the present invention will become apparent from the following description of exemplary embodiments with reference to the attached drawings.

DESCRIPTION OF THE EMBODIMENTS

The configuration of a display panel will now be described in accordance with a first embodiment of the present invention with reference to FIG. 1. First, a thin film transistor (TFT) and a planarization film are provided on a substrate. Then, a transparent conductive oxide (TCO) electrode 124 (first electrode including an indium tin oxide (ITO), etc.) provided on the light extraction side and a second electrode (including aluminum (Al), for example) are provided on the planarization film to sandwich a light emitting layer (not shown) between the TCO electrode 124 and the second electrode. The light emitting layer may be, for example, an organic film which emits light when an electrical potential is applied across the film.

Figure 3:
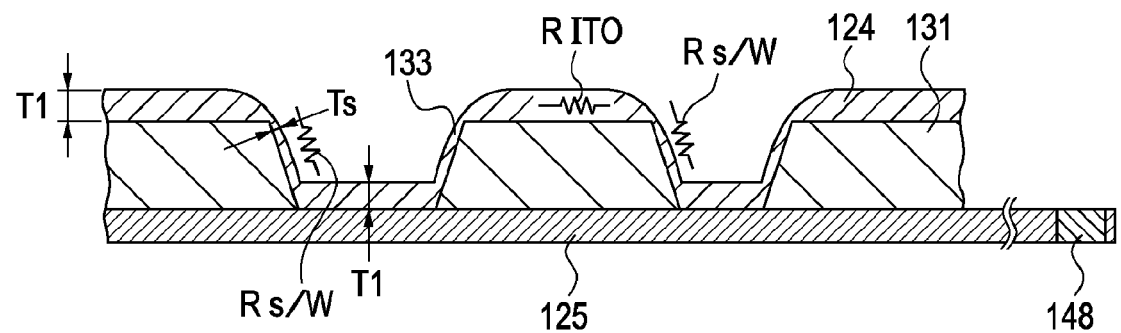
FIG. 3 shows an exemplary vertical structure of the contact hole section according to the first embodiment.

Next, a contact hole 1 (110 and 113) and a contact hole 2 (111 and 114) are provided in a current path extending from the TCO electrode 124 to a ground (GND) end 116 and a PAD section 148 (shown in FIG. 3).

First, a current flowing from the TCO electrode 124 (first electrode) with a high resistance flows into the contact hole 1 which is close to a display region 100 of the TCO electrode 124. Then, a residual current which did not flow into the contact hole 1, (e.g., a current flowing between holes 110 and 113) flows into the contact hole 2. Here, the distance between the contact hole 2 and the display region 100 is longer than that between the contact hole 1 and the display region 100, and the residual current flows into the contact hole 2.

At that time, most of the current flows into the contact hole 1. Once the current flows into the contact hole 1, the current does not return to the TCO electrode 124 with a resistance higher than that of wiring. Therefore, the amount of current flowing into the contact hole 2 is smaller than that of current flowing into the contact hole 1.

Consequently, the opening area of the contact hole 2 is made smaller than that of the contact hole 1, and thus the opening area of the contact hole 2 may not be unnecessarily increased.

However, if the opening area of the contact hole 2 is made immoderately small, the current density relative to the opening area is increased so that heat is generated and power is lost. Therefore, the current densities of the contact holes 1 and 2 are equalized to equalize the current flowabilities of the contact holes 1 and 2. Consequently, it becomes possible to reduce power losses and avoid increasing the opening area unnecessarily, and a narrowed frame is achieved.

Power is transmitted to a pixel circuit unit 123 via a VCC power end 115, the PAD section 148, power wiring 117, and a power distribution line 121. The PAD section 148 is shown in FIG. 3.

Further, the GND end 116 is connected to the TCO electrode 124 via wiring 125 (GND wiring) with a low resistance, the contact hole 1 (110 and 113), and the contact hole 2 (111 and 114) to supply power to the pixel circuit unit 123. Here, the opening area of the contact hole 2 is smaller than that of the contact hole 1. Further, in the above-described embodiment, the TCO electrode 124 includes an ITO having translucency and conductivity, so as to extract light from the TCO-electrode-124 side. Further, each of the contact holes 1 and 2 is formed by etching the planarization film provided to planarise the surface asperities of a drive TFT (thin film transistor) provided on the substrate. The planarization film is formed not only on the display region 100, but also on the substrate of a non-display region.

Figure 1:
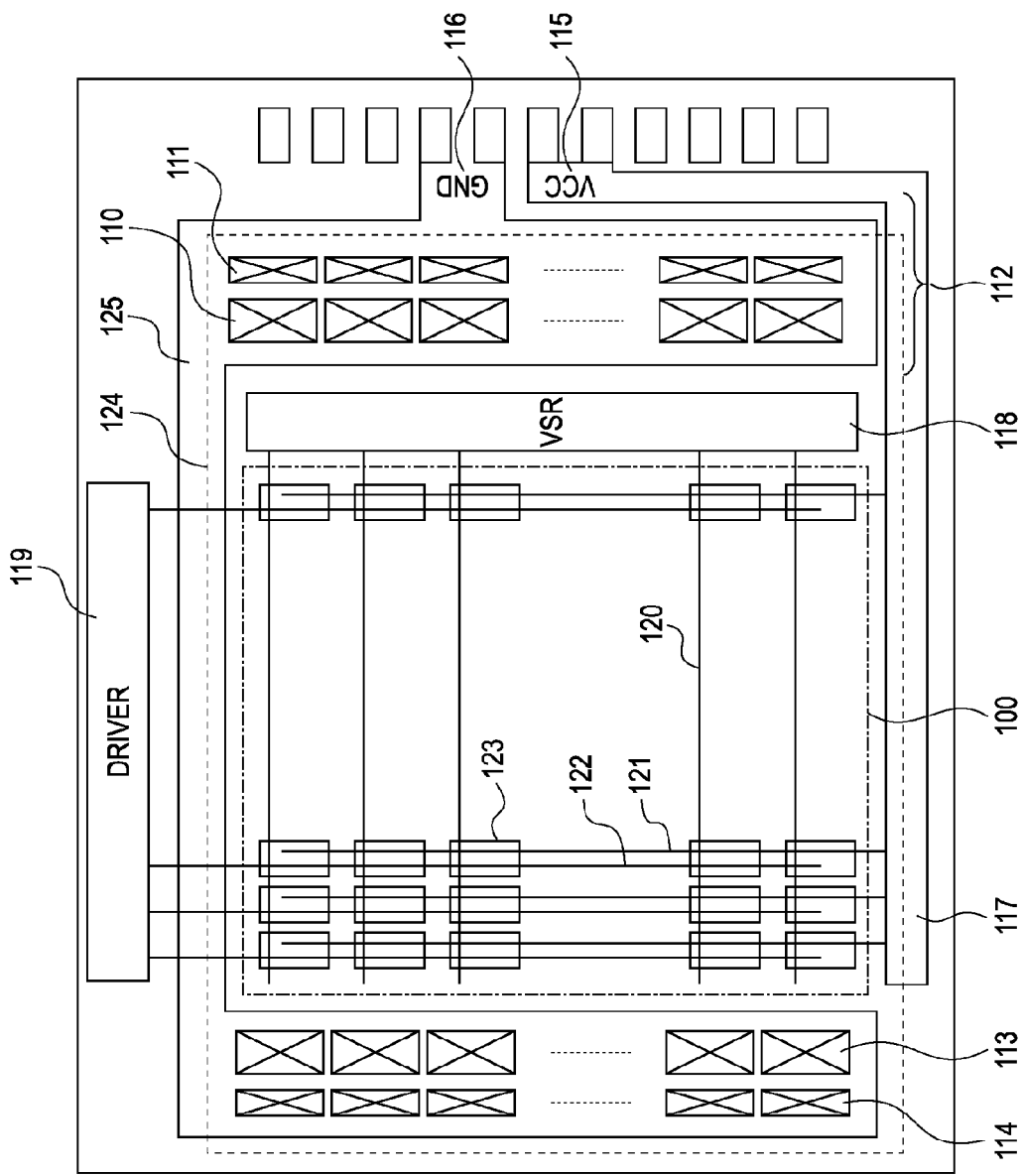
FIG. 1 is a schematic diagram showing an exemplary configuration of a panel according to a first embodiment of the present invention.

A vertical shift resistor (VSR) 118 scans the pixel circuit units 123 in sequence in the direction from top to bottom in FIG. 1. Then, the VSR 118 transmits an output produced by the pixel circuit unit 123 to a VSR output end 120.

A driver 119 externally transmits an RGB video signal for each column. Then, an output end 122 provided for each column is connected to the pixel circuit units 123.

A signal may be transmitted to the VSR 118, a signal transmitted to the driver 119, the PAD section 148, the wiring, and so forth.

Figure 2:
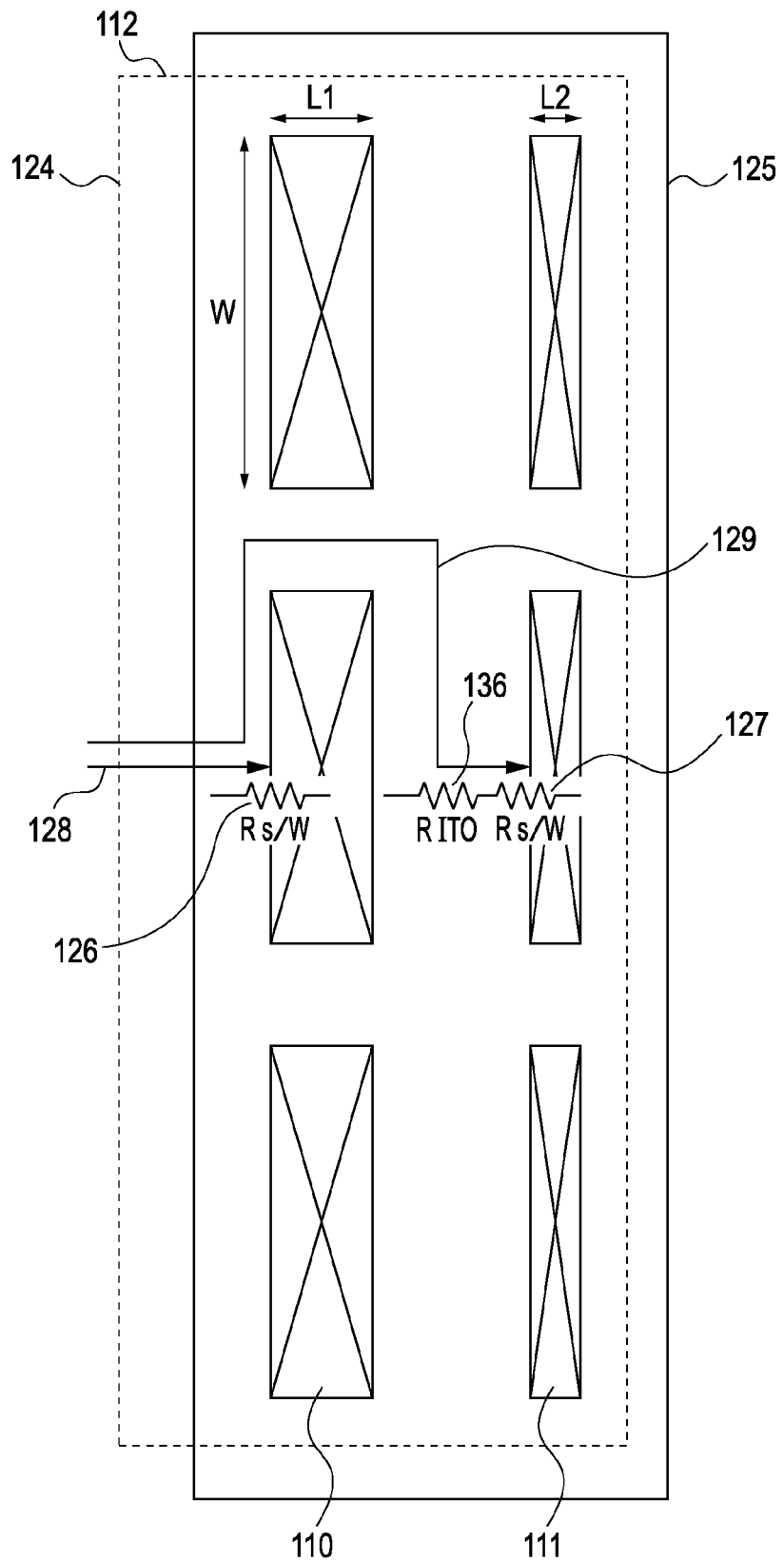
FIG. 2 shows a contact hole section according to the first embodiment.
Figure 4:
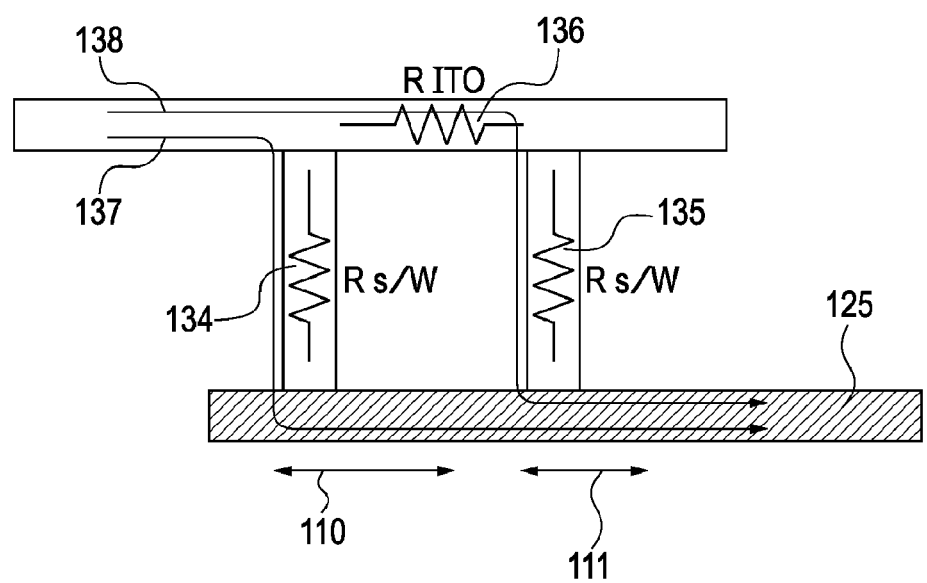
FIG. 4 is an equivalent circuit diagram of the contact hole section according to the first embodiment.

FIG. 2 is an enlarged illustration of a contact hole section 112. FIG. 3 is a sectional view of the contact hole section 112, and FIG. 4 is an equivalent circuit diagram showing a resistance parasitic on each of the contact holes 1 and 2, and a resistance of the TCO electrode 124.

In FIG. 2, the vertical length and the horizontal length of the contact hole 1 (110 and 113) are determined to be W and L1. Further, the vertical length and the horizontal length of the contact hole 2 (111 and 114) are determined to be W and L2. In the above-described embodiment, the contact holes 1 and 2 are arranged in the form of grating. In a second embodiment of the present invention, which will be described later, the contact holes 1 and 2 are staggered.

Further, in FIG. 3 which will be described below, the opening size of the contact hole at the bottom thereof is different from that of the contact hole at the uppermost part of the side wall thereof.

The inclination width is negligibly small compared with the opening size, and the opening size observed at the bottom is almost equal to that observed at the uppermost part of the side wall. Therefore, the horizontal length is determined to be L1 and/or L2.

In FIG. 2, each of current paths 128 and 129 that are provided for currents flowing from the light-emitting devices extends in a horizontal direction from left to right. The above-described configuration indicates that a current flowing into the TCO electrode 124 flows from the display region 100 toward the contact holes 1 and 2.

Next, a schematic diagram of the current paths and the parasitic resistances will be described below.

The current path 128 is provided in the contact hole 1 (110 and 113), and the current path 129 is provided in the contact hole 2 (111 and 114). Further, a resistance Rs/W (126) exists in the current path 128, and a resistance RITO (136)+Rs/W (127) exists in the current path 129. Further, since the TCO electrode 124 includes the ITO, the resistance is expressed by the sign RITO and will be in descriptions that follow. Further, a resistance Rs denotes a resistance per unit length in the current flow direction and a vertical direction. The sign W denotes the vertical length of each of the contact holes 1 and 2 as described above.

Next, the current paths and the parasitic resistances will be described with reference to FIG. 3 showing the sectional view of the configurations of the contact holes.

First, the film of a side wall 133 of the TCO electrode 124 provided in the contact hole 1 (110 and 113) passing through the current path 128 is formed. The thickness of the film Ts becomes smaller than a film thickness T1 indicating the film thickness of a flat section.

Therefore, the resistance Rs/W of the side wall of the TCO electrode 124 is larger than the resistance RITO of the flat section and the relation Rs/W>RITO is satisfied.

On the other hand, in the current path 129, the wiring resistance RITO of the TCO electrode 124 and the resistance Rs/W of the side wall of the contact hole 2 are connected in series. Further, a current that had once flowed into the contact hole 1 does not flow into the contact hole 2. This is because the current flows into the wiring 125 with the low resistance, which is provided in the contact hole 1.

Further, part of a planarization film 131 (shown in FIG. 3) is provided between the TCO electrode 124 and the low-resistant wiring 125, and is removed through lithography processing so as to form the contact hole 1 (110 and 113) and the contact hole 2 (111 and 114).

FIG. 4 shows a resistance parasitic on the current path 137 corresponding to the current path 128 shown in FIG. 2 and that parasitic on the current path 138 corresponding to the current path 129 shown in FIG. 2.

According to FIGS. 3 and 4, the resistance of the contact hole 1 extending from the display region 100 of the TCO electrode 124 to the low-resistant wiring 125 is the resistance Rs/W (134) observed at the inclination part of the contact hole 1. Although a resistance exists in part of the TCO electrode 124, the part extending from the display region 100 to the contact hole 1, the distance is short and a contributing resistance is low, so its description is omitted for the sake of simplicity.

On the other hand, a combined resistance obtained by combining the resistance RITO (136) of part of the TCO electrode 124, the part extending from the display region 100 to the contact hole 2, and the resistance Rs/W (135) of the contact hole 2 is expressed as RITO+(Rs/W). This is because there is the resistance RITO of the part of the TCO electrode 124, the part extending from the display region 100 to the contact hole 2.

Under the above-described stipulations, the ratio of the size of the contact hole width L1 to that of the contact hole width L2, which can reduce the power losses while attaining a narrow frame, is calculated.

First, since a potential occurring in the current path 1 is equal to that occurring in the current path 2, Equations (1) and (2) hold as below.

$$I1\cdot(Rs/W)=I2\cdot(RITO+Rs/W) \quad \text{Equation (1)}$$

$$I1:I2=(RITO+Rs/W):Rs/W \quad \text{Equation (2)}$$

Next, the density of a current flowing into the contact hole 1 is equalized to that of a current flowing into the contact hole 2. Consequently, the flowability of the current flowing into the contact hole 1 is equalized to that of the current flowing into the contact hole 2. The above-described configuration allows for reducing heat generated due to a high current density and attaining a narrow frame. Here, the term "current density" denotes the amount of a current flowing per unit area.

Here, the current density observed in the contact hole 1 is expressed as I1/(W×L1). Further, the current density observed in the contact hole 2 is expressed as I2/(W×L2). In the above-described embodiment, the width (W) of the contact hole 1 is equal to that of the contact hole 2.

The ratio of the contact hole width L1 to the contact hole width L2 is expressed by Equation (3) based on the definition of the current density and Equation (2), where Equation (3) is:

$$L1:L2=(RITO+Rs/W):Rs/W \quad \text{Equation (3),}$$

(where relations W>L1 and W>L2 are satisfied). Namely, the current densities of the contact holes 1 and 2 can be equalized by selecting the contact hole widths L1 and L2 that satisfy Equation (3).

Thus, the contact holes 1 and 2 are provided in the form of grating and configured such that the current densities are equalized. Consequently, it becomes possible to equalize resistances parasitic on the individual contact holes, which also makes it possible to reduce irregularities in the brightness.

In FIG. 2, the current path 2 is indicated only by a current flowing from above the contact hole 1. However, the current branches off and the branched currents flow from above and under the contact hole 1 (not shown). Namely, the currents flow from the circumference of the contact hole 1 into the contact hole 2. Since a flowing current is equal to a parasitic resistance in the above-described embodiment, the current and the resistance are simply shown so as to draw calculations with facility.

Thus, the high-resistant TCO electrode 124 is connected to the low-resistant wiring 125 via the contact holes 1 and 2. In that case, the most appropriate shape of the contact hole may be provided by referring to Equation (3).

According to the ratio of the size of the contact hole width L1 to that of the contact hole width L2, the contact hole width L2 has the minimum value or more.

A plurality of the contact holes 2 having the contact hole width L2 may be provided.

In FIG. 1, the contact holes 1 and 2 are exemplarily arranged on two sides in the display apparatus. However, the contact holes 1 and 2 may be arranged on a single side and/or three sides or more. In that case, the contact hole 1 is arranged on an innermost part relative to the display region 100 and the contact hole 2 is arranged on an outermost part relative to the display region 100.

In the above-described configuration, the TCO electrode 124 is used as a cathode and the low-resistant wiring 125 is used as GND wiring. Here, the vertical structure of the EL device may be reversed and the light-emitting-face side becomes an anode power supply. In that case, the low-resistant wiring 125 functions as power wiring and the TCO electrode 124 functions as an anode.

Figure 5:
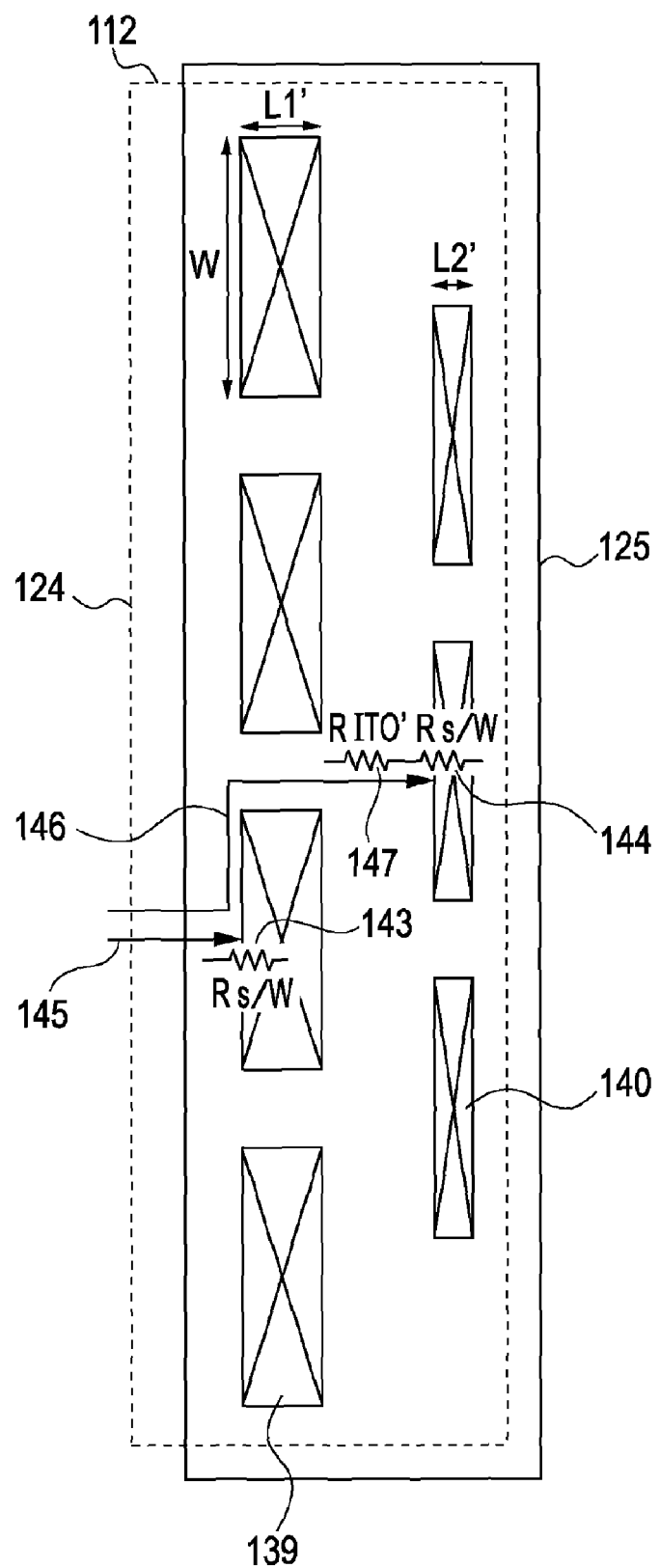
FIG. 5 shows a contact hole section according to a second embodiment of the present invention.

FIG. 5 shows the shape of each of the contact holes 1 and 2, the shape being determined according to a second embodiment of the present invention.

Compared to the first embodiment where the contact holes 1 and 2 are arranged in the form of grating, contact holes 1' (139) and 2' (140) are staggered in the second embodiment. The second embodiment is in other respects configured in the same manner as the first embodiment.

Consequently, the size of a resistance RITO' 147 parasitic on a current path 146 extending from the display region 100 to the contact hole 2' (140) becomes different from that of the resistance RITO 136 parasitic on the current path extending from the display region 100 to the contact hole 2, which is described in the first embodiment.

Namely, the value of the resistance RITO' 147 is lower than that of the resistance RITO 136 due to the difference between the current path distances. That is to say, the distance between the display region 100 and the contact hole 2 is longer than that between the display region 100 and the contact hole 2'.

Figure 6:
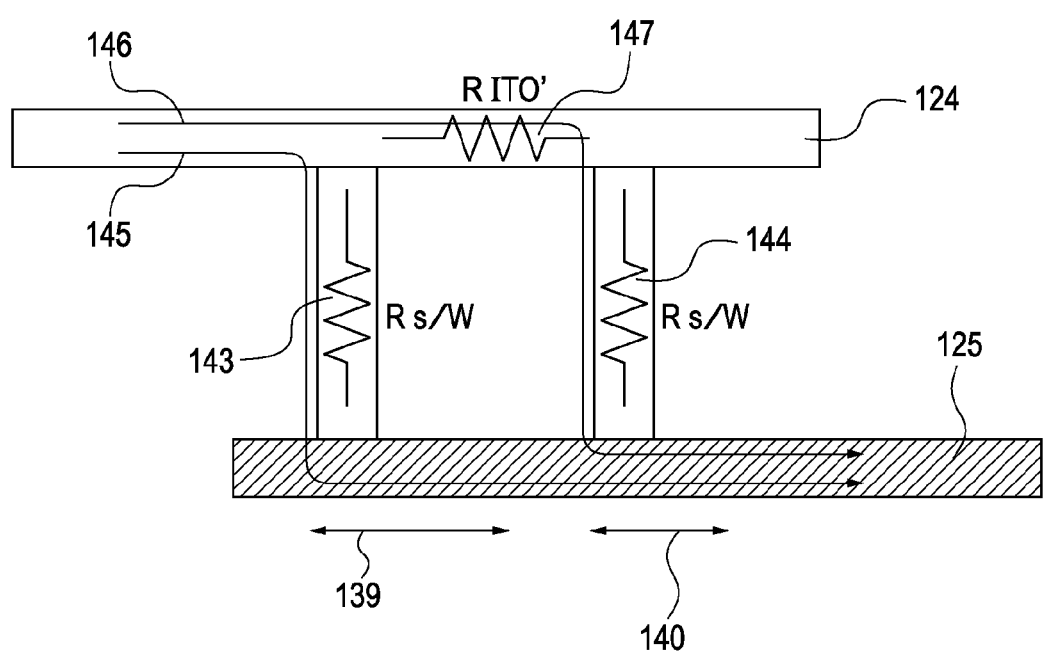
FIG. 6 is an equivalent circuit diagram of the contact hole section according to the second embodiment.

FIG. 6 is an equivalent circuit diagram showing resistances parasitic on the current paths.

FIG. 6 shows a resistance Rs/W 143 parasitic on a current path 145 of a current flowing into the contact hole 1' and a resistance RITO' (147)+Rs/W (144) parasitic on a current path 146 of a current flowing into the contact hole 2'.

Here, the relation RITO 136>RITO' 147 is satisfied according to FIGS. 4 and 6. Consequently, the combined resistance RITO' (147)+Rs/W (144) of the second embodiment is lower than the combined resistance RITO (136)+Rs/W (135) of the first embodiment.

Under the above-described stipulations, the ratio of the size of a contact hole width L1' to that of a contact hole width L2', which can reduce the power losses while attaining a narrow frame, is calculated.

The method of calculating the size ratio is the same as that of the first embodiment.

According to FIG. 5, the resistance of the contact hole 1' extending from the display region 100 of the TCO electrode 124 to the low-resistant wiring 125 is the resistance Rs/W observed at the inclination part of the contact hole 1'.

On the other hand, a combined resistance obtained by combining the resistance of the contact hole 2' extending from the display region 100 to the low-resistant wiring 125 and that of the current path 146 is expressed as RITO'+Rs/W. This is because there is the resistance RITO' of the part of the TCO electrode 124, the part extending from the display region 100 to the contact hole 2'.

Under the above-described stipulations, the ratio of the size of the contact hole width L1' to that of the contact hole width L2' is calculated based on Equation (5) that follows. Since the calculation method is the same as that of the first embodiment, redundant description thereof is omitted.

$$L1':L2'=(RITO'+Rs/W):Rs/W \quad \text{Equation (5)}$$

Namely, the current densities of the contact holes 1' and 2' can be equalized by selecting the contact hole widths L1' and L2' that satisfy Equation (5), so that a narrow frame can be attained.

Thus, the contact holes 1' and 2' are staggered and configured such that the current densities are equalized. Consequently, it becomes possible to equalize resistances parasitic on the individual contact holes, which also makes it possible to reduce irregularities in the brightness.

Thus, the high-resistant TCO electrode 124 is connected to the low-resistant wiring 125 via the contact holes 1' and 2'. In that case, the most appropriate shape and arrangement of at least one contact hole can be provided by referring to Equation (5).

According to the ratio of the size of the contact hole width L1' to that of the contact hole width L2', the contact hole width L2' has the minimum value or more.

Although the organic light-emitting devices are used in the above-described embodiments, the present invention may be used for any case, for example, the case where a liquid crystal panel with an electrode including a high-resistant TCO connected to a low-resistant electric conductor is achieved.

Further, the contact holes 1' and 2' may be arranged on at least one side of the display apparatus. Further, the contact hole 1' may be arranged on an innermost part and the contact hole 2' may be arranged on an outermost part.

According to the above-described embodiments, the TCO electrode 124 is used as a cathode and the low-resistant wiring 125 is used as GND wiring. The vertical structure of the EL device may alternatively be reversed and the light-emitting-face side becomes an anode power supply. In that case, the low-resistant wiring 125 functions as power wiring and the TCO electrode 124 functions as an anode.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Patent Application No. 2008-314606 filed on Dec. 10, 2008, which is hereby incorporated by reference herein in its entirety.

What is claimed is:

1. A display apparatus comprising:
a substrate;
a thin-film transistor and a wiring with a resistance lower than a resistance of a first electrode provided on the substrate, the wiring extending from a terminal and being disposed along a side of a display region;
a planarization film provided on the thin-film transistor and the wiring extending from the terminal; and
a plurality of light-emitting devices provided on the planarization film to provide a display region,
wherein, in the light-emitting device, a second electrode, a light-emitting layer, and a first electrode are stacked on the substrate in that order,
wherein a plurality of first contact holes and a plurality of second contact holes are provided in the planarization film at a part outside the display region to connect the first electrode to the wiring extending from the terminal, and
wherein
the first contact holes and the second contact holes are disposed in parallel to each other along the wiring extending from the terminal,
a distance between the second contact hole and the display region is longer than a distance between the first contact hole and the display region, and
an opening area of the second contact hole is smaller than an opening area of the first contact hole so that a current density of the first contact hole is substantially equal to a current density of the second contact hole.

2. The display apparatus according to claim 1, wherein when a width of the first contact hole and a width of the second contact hole, where each of these widths are defined relative to a direction of a current flowing from the display region to the first contact hole, are individually determined to be L1 and L2, and when each of a width of the first contact hole and a width of the second contact hole, these latter widths being perpendicular to the current direction, is determined to be W, a relation L1 >L2 is satisfied.

3. The display apparatus according to claim 1, wherein the first contact holes and the second contact holes are arranged in a form of grating.

4. The display apparatus according to claim 1, wherein when the first electrode is a cathode, the wiring connected to the first electrode is ground wiring.

* * * * *